United States Patent
Zwinger et al.

(10) Patent No.: US 8,467,912 B2
(45) Date of Patent: Jun. 18, 2013

(54) CONTROLLING A COOLING FAN FOR A STORAGE ARRAY

(75) Inventors: Steven F. Zwinger, Poway, CA (US); Kalyanaraman Vaidyanathan, San Diego, CA (US); Kenny C. Gross, San Diego, CA (US)

(73) Assignee: Oracle America, Inc., Redwood Shores, CA (US)

( * ) Notice: Subject to any disclaimer, the term of this patent is extended or adjusted under 35 U.S.C. 154(b) by 487 days.

(21) Appl. No.: 12/189,486

(22) Filed: Aug. 11, 2008

(65) Prior Publication Data
US 2010/0033922 A1 Feb. 11, 2010

(51) Int. Cl.
*G05D 23/00* (2006.01)
*G06F 11/00* (2006.01)
*G06F 17/00* (2006.01)
*G06F 19/00* (2011.01)

(52) U.S. Cl.
USPC .......... 700/300; 700/90; 700/99; 714/37; 714/39; 714/47.1; 714/48

(58) Field of Classification Search
USPC ............ 700/90, 99, 300; 432/36; 714/37, 714/39, 47, E11.204, 47.1, 48
See application file for complete search history.

(56) References Cited

U.S. PATENT DOCUMENTS

| | | | |
|---|---|---|---|
| 6,487,463 B1 * | 11/2002 | Stepp, III | 700/79 |
| 7,310,738 B2 * | 12/2007 | Bhagwath et al. | 713/300 |
| 7,424,806 B2 * | 9/2008 | Tien et al. | 62/178 |
| 7,991,515 B2 * | 8/2011 | Lyon et al. | 700/300 |
| 8,190,276 B2 * | 5/2012 | Lewis et al. | 700/25 |
| 2004/0078723 A1 * | 4/2004 | Gross et al. | 714/47 |
| 2004/0088406 A1 * | 5/2004 | Corley et al. | 709/224 |
| 2005/0188263 A1 * | 8/2005 | Gross et al. | 714/25 |
| 2012/0209449 A1 * | 8/2012 | Alon | 700/300 |
| 2012/0265363 A1 * | 10/2012 | Hung et al. | 700/300 |

* cited by examiner

*Primary Examiner* — Mohammad Ali
*Assistant Examiner* — Jennifer L Norton
(74) *Attorney, Agent, or Firm* — Parl, Vaughan, Fleming & Dowler, LLP

(57) ABSTRACT

Some embodiments of the present invention provide a system that controls a cooling fan for a storage array. During operation, an input-output (I/O) metric of the storage array is monitored. Then, the cooling fan is controlled based on the I/O metric.

13 Claims, 2 Drawing Sheets

CONTROLLING A COOLING FAN FOR A STORAGE ARRAY

BACKGROUND

1. Field

The present invention generally relates to techniques for operating an external storage array. More specifically, the present invention relates to a method and apparatus that controls a cooling fan for a storage array.

2. Related Art

Some external storage array manufacturers are working to increase the electrical efficiency of their external storage arrays, and cooling fans can be one source of inefficiency. Typically, cooling fans for external storage arrays are set to have a high nominal fan speed so that there is adequate thermal margin, even for an external storage array running at full load and at altitudes as high as 10,000 feet above sea level, where the air is thinner and less effective at cooling. Therefore, for external storage arrays operating in less extreme conditions, cooling fans may be running at higher speeds than required to adequately cool the external storage array. Reducing the nominal cooling fan speed may reduce the power used by the cooling fan, but since many external storage arrays do not have internal temperature measurement devices, controlling the cooling fan based on a measured temperature for the external storage array may not be possible.

Hence, what is needed is a method and apparatus that controls a cooling fan for an external storage array, without the above-described problems.

SUMMARY

Some embodiments of the present invention provide a system that controls a cooling fan for a storage array. During operation, an input-output (I/O) metric of the storage array is monitored. Then, the cooling fan is controlled based on the I/O metric.

In some embodiments, controlling the cooling fan based on the I/O metric includes controlling the cooling fan based on a pattern-recognition model generated during a training phase.

In some embodiments, the model includes a nonlinear nonparametric model.

In some embodiments, generating the pattern-recognition model during the training phase includes generating the pattern-recognition model based on I/O metric and thermal dynamics of a training storage array measured during the training phase.

In some embodiments, the I/O metric includes at least one of a read rate and a write rate.

In some embodiments, monitoring the I/O metric includes systematically monitoring and recording a set of performance parameters of the computer system, wherein the recording process keeps track of the temporal relationships between events in different performance parameters.

In some embodiments, controlling the cooling fan includes using a multiple input, multiple output (MIMO) controller that controls the fan speed based on correlations, generated during a training phase, between the I/O metric and a temperature of the storage array.

In some embodiments, the storage array includes a disk drive storage array.

DETAILED DESCRIPTION

The following description is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present description. Thus, the present description is not intended to be limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact disks), DVDs (digital versatile disks or digital video disks), or other media capable of storing computer-readable media now known or later developed.

Figure 1:
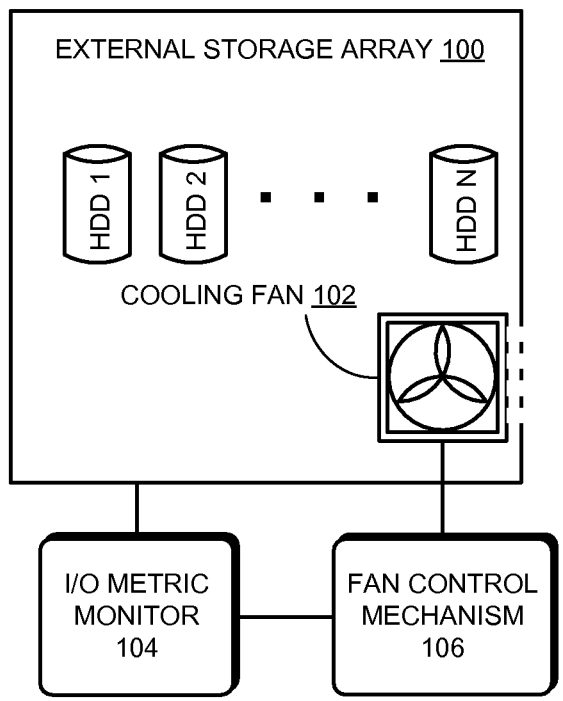
FIG. 1 represents a system that controls a cooling fan for an external storage array in accordance with some embodiments of the present invention.

FIG. 1 represents a system that controls a cooling fan for an external storage array in accordance with some embodiments of the present invention. External storage array 100 includes cooling fan 102, and N hard disk drives (HDDs), with HDD1, HDD2, and HDD N depicted. Input-output (I/O) metric monitor 104 is coupled to external storage array 100 and fan control mechanism 106, and fan control mechanism 106 is coupled to cooling fan 102.

External storage array 100 can include any type of external storage array that stores data in an array of HDDs. In some embodiments, external storage array 100 can be implemented using storage devices other than HDDs, including but not limited to compact disk (CD) drives, digital video disk (DVD) drives, any other disk drive based storage device, or any other storage device now known or later developed.

Cooling fan 102 can include any cooling mechanism for external storage array 100 implemented in any technology. In some embodiments, cooling fan 102 includes a cooling fan controller.

1/0 metric monitor 104 monitors an I/O metric of external storage array 100. In some embodiments, the I/O metric includes at least one of a read rate, and a write rate for external storage array 100. I/O metric monitor 104 can be implemented in any combination of hardware and software. In some embodiments, I/O metric monitor 104 operates on a computer system. In other embodiments, I/O metric monitor 104 operates on one or more service processors. In still other embodiments, I/O metric monitor 104 is located inside of external storage array 100. In some embodiments, I/O metric monitor 104 includes an apparatus and/or method for monitoring and recording computer system performance parameters as set forth in U.S. Pat. No. 7,020,802, entitled "Method and Apparatus for Monitoring and Recording Computer System Performance Parameters," by Kenny C. Gross and Larry G. Votta, Jr., issued on 28 Mar. 2006, which is hereby fully incorporated by reference.

Fan control mechanism 106 receives information from I/O metric monitor 104 related to the monitored I/O metric and controls cooling fan 102 based on the monitored I/O metric. Note that fan control mechanism 106 can be implemented in any combination of hardware and software. In some embodiments, fan control mechanism 106 operates on a computer system. In other embodiments, fan control mechanism 106 operates on one or more service processors. In still other embodiments, fan control mechanism 106 is located inside of external storage array 100.

Some embodiments of the present invention operate as follows. During operation of external storage array 100, I/O metric monitor 104 monitors the I/O metrics of external storage array 100. I/O metric monitor 104 then sends a signal to fan control mechanism 106 based on the monitored I/O metric. Fan control mechanism then controls cooling fan 102 based on the monitored I/O metric. In some embodiments, fan control mechanism 106 implements a model generated during a training phase as described below with reference to FIGS. 3 and 4. In some embodiments, external storage array 100 includes more than one cooling fan. In some embodiments, fan control mechanism 106 includes a multiple input, multiple output (MIMO) controller. The MIMO controller receives multiple inputs, including but not limited to read rate and write rate information for external storage array 100 from I/O metric monitor 104. The MIMO controller then uses correlations among the input signals between monitored I/O metrics, learned during a training phase, to generate signals to control the cooling fans.

Figure 2:
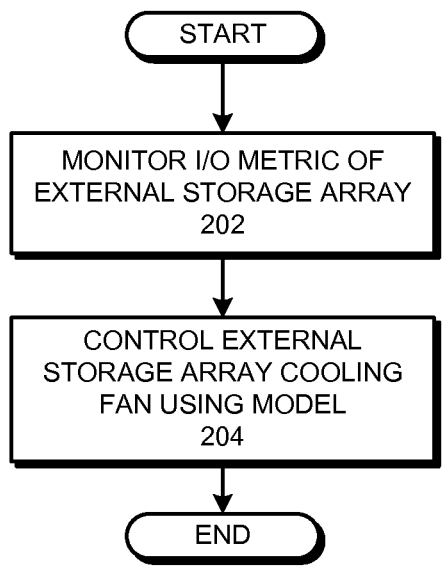
FIG. 2 presents a flowchart illustrating a process for controlling a cooling fan for an external storage array in accordance with some embodiments of the present invention.

FIG. 2 presents a flowchart illustrating a process for controlling a cooling fan for an external storage array in accordance with some embodiments of the present invention. First, the I/O metric of the external storage array is monitored (step 202). Then, the external cooling fan is controlled using a model (step 204). In some embodiments, the model is generated during a training phase as described with reference to FIGS. 3 and 4.

Figure 3:
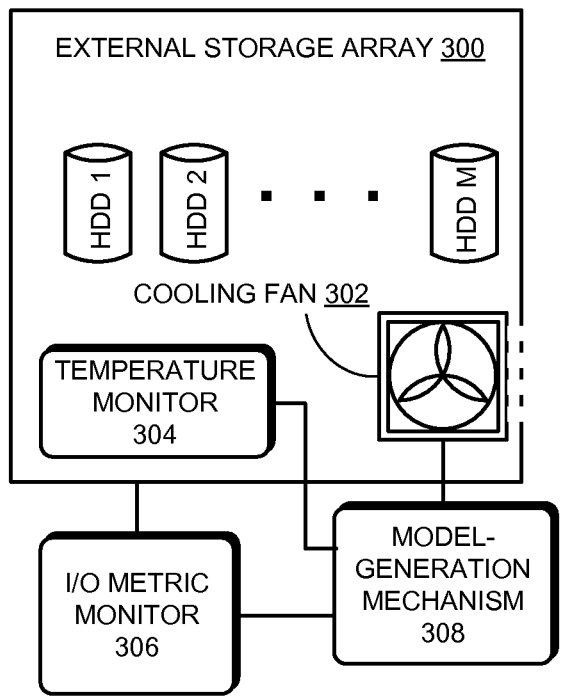
FIG. 3 represents a system that trains a model that controls a cooling fan for an external storage array in accordance with some embodiments of the present invention.

FIG. 3 represents a system that trains a model that controls a cooling fan for an external storage array in accordance with some embodiments of the present invention. External storage array 300 includes cooling fan 302, temperature monitor 304, and M HDDs, with HDD 1, HDD 2, and HDD M depicted. Input-output (I/O) metric monitor 306 is coupled to external storage array 300 and model-generation mechanism 308, and model-generation mechanism 308 is coupled to cooling fan 302.

External storage array 300 can include any type of external storage array that stores data in an array of HDDs. In some embodiments, external storage array 300 can be implemented using storage devices other than HDDs, including but not limited to CD drives, DVD drives, any other disk drive based storage device, or any other storage device now known or later developed. In some embodiments, external storage array 300 is a similar or the same external storage array as external storage array 100. In some embodiments, there are N HDDs in external storage array 300 and each HDD is the same or similar to HDDs in external storage array 100, and cooling fan 302 is the same or a similar cooling fan as cooling fan 102.

Temperature monitor 304 can be any device that can monitor a temperature of external storage array 300 and send a signal to model-generation mechanism 308 related to the monitored temperature. Temperature monitor 304 can be implemented in any technology now known or later developed.

I/O metric monitor 306 monitors an I/O metric of external storage array 300. In some embodiments, the I/O metric includes at least one of a read rate and a write rate for external storage array 300. I/O metric monitor 306 can be implemented in any combination of hardware and software. In some embodiments, I/O metric monitor 306 operates on a computer system. In other embodiments, I/O metric monitor 306 operates on one or more service processors. In still other embodiments, I/O metric monitor 306 is located inside of external storage array 300. In some embodiments, I/O metric monitor 306 includes an apparatus and/or method for monitoring and recording computer system performance parameters as set forth in U.S. Pat. No. 7,020,802.

Model-generation mechanism 308 receives the information from temperature monitor 304 related to the temperature of external storage array 300 and information from I/O metric monitor 306 related to the monitored I/O metric monitored from external storage array 300. This information is then used to generate a model to control cooling fan 302 based on the I/O metric of external storage array 300. In some embodiments, the model generated by model generation mechanism includes a pattern-recognition model. In some embodiments, model-generation mechanism 308 uses a nonlinear, nonparametric (NLNP) pattern-recognition technique to cross correlate the monitored I/O metric with the temperature monitored by temperature monitor 304.

In some embodiments, while model-generation mechanism 308 is generating the model, an I/O metric script is run that causes the I/O metric of external storage array 300 to generate a predetermined level or pattern of I/O metric. In some embodiments, the I/O metric script is run on a computer system attached to external storage array 300 and causes the computer system to read data from and/or write data to external storage array 300 at a predetermined level or in a predetermined pattern as model-generation mechanism 308 generates the model.

Figure 4:
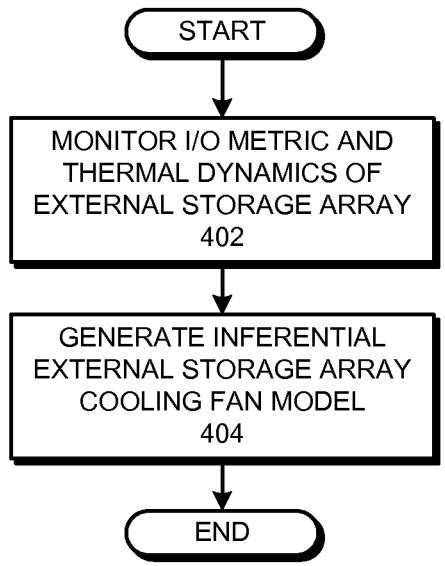
FIG. 4 presents a flowchart illustrating a process that trains a model for controlling a cooling fan for an external storage array in accordance with some embodiments of the present invention.

FIG. 4 presents a flowchart illustrating a process that trains a model for controlling a cooling fan for an external storage array in accordance with some embodiments of the present invention. First, the I/O metric and thermal dynamics of the external storage array are monitored (step 402). Then, an inferential external storage array cooling fan model is generated (step 404). In some embodiments, the model generated using the above process is used in the process described in FIG. 2 or in the system depicted in FIG. 1.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A method for controlling a cooling fan for a storage array, the method comprising:
   receiving a pattern-recognition model that is generated during a training phase by using a computer system,
   wherein the pattern-recognition model is generated based on measuring at least one of a read rate or a write rate for a training storage array using an input-output metric monitor;

measuring corresponding thermal dynamics for the training storage array using a temperature sensor in the training storage array;

generating the pattern-recognition model based on the measured at least one of the read rate or the write rate for the training storage array and the measured corresponding thermal dynamics for the training storage array; and using the pattern-recognition model to generate a signal to control a cooling fan based on the at least one of the read rate or the write rate for the storage array.

2. The method of claim 1, wherein the pattern-recognition model includes a nonlinear nonparametric model.

3. The method of claim 1, further comprising:

while monitoring the at least one of the read rate or the write rate for the storage array, recording the at least one of the read rate or the write rate for the storage array at two or more different times, wherein each record comprises an indication of the temporal relationship between the recorded at least one of the read rate or the write rate for the storage array.

4. The method of claim 1, wherein controlling the cooling fan includes using a multiple input, multiple output (MIMO) controller that controls the fan speed based on correlations, generated during a training phase, between the at least one of the read rate or the write rate for the storage array and a temperature of the storage array.

5. The method of claim 1, wherein the storage array includes a disk drive storage array.

6. A computer-readable storage medium storing instructions that when executed by a computer cause the computer to perform a method for controlling a cooling fan for a storage array, the method comprising:

receiving a pattern-recognition model that is generated during a training phase by using a computer system, wherein the pattern-recognition model is aenerated based on measuring at least one of a read rate or a write rate for a training storage array using an input-output metric monitor;

measuring corresponding thermal dynamics for the training storage array using a temperature sensor in the training storage array;

generating the pattern-recognition model based on the measured at least one of the read rate or the write rate for the training storage array and the measured corresponding thermal dynamics for the training storage array; and using the pattern-recognition model to generate a signal to control a cooling fan based on the at least one of the read rate or the write rate for the storage array.

7. The computer-readable storage medium of claim 6, wherein the pattern-recognition model includes a nonlinear nonparametric model.

8. The computer-readable storage medium of claim 6, further comprising:

while monitoring the at least one of the read rate or the write rate for the storage array, recording at least one of the read rate or the write rate for the storage array at two or more different times, wherein each record comprises an indication of the temporal relationship between the recorded at least one of the read rate or the write rate for the storage array.

9. The computer-readable storage medium of claim 6, wherein controlling the cooling fan includes using a multiple input, multiple output (MIMO) controller that controls the fan speed based on correlations, generated during a training phase, between the at least one of the read rate or the write rate for the storage array and a temperature of the storage array.

10. The computer-readable storage medium of claim 6, wherein the storage array includes a disk drive storage array.

11. An apparatus that controls a cooling fan for a storage array, the apparatus comprising:

a receiving mechanism that receives a pattern-recognition model that is generated during a training phase by using a computer system, wherein the pattern-recognition model is generated based on at least one of a read rate or a write rate for a training storage array using an input-output metric monitor and corresponding thermal dynamics for the training storage array, and wherein the pattern-recognition model is generated by causing the computer system to at least one of read from or write to the training storage array at a predetermined level or in a predetermined a monitoring mechanism that monitors at least one of a read rate or a write rate for the storage array; and a controlling mechanism that uses the pattern-recognition model to generate a signal to control a cooling fan based on the at least one of the read rate or the write rate for the storage array.

12. The method of claim 1, wherein the model is generated by causing the computer system to at least one of read from or write to the training storage array in a predetermined pattern.

13. The method of claim 1, wherein the model is generated by causing the computer system to at least one of read from or write to the training storage array at a predetermined level.

* * * * *